(12) United States Patent
Bougaud et al.

(10) Patent No.: US 7,102,360 B2
(45) Date of Patent: Sep. 5, 2006

(54) PROCEDURE TO MEASURE GROUNDING RESISTANCES OF ELECTRICAL INSTALLATIONS BY MEASURING THE LOOP IMPEDANCE

(75) Inventors: Patrick Bougaud, Paris (FR); Bernard Kantorowski, Paris (FR); Daniel Arnoux, Paris (FR); Axel Arnoux, Paris (FR)

(73) Assignee: Chauvin Arnoux, Neuilly sur Seine (FR)

( * ) Notice: Subject to any disclaimer, the term of this patent is extended or adjusted under 35 U.S.C. 154(b) by 0 days.

(21) Appl. No.: 11/061,043

(22) Filed: Feb. 18, 2005

(65) Prior Publication Data

US 2005/0200366 A1    Sep. 15, 2005

(30) Foreign Application Priority Data

Feb. 18, 2004    (FR) .................................. 04 01624

(51) Int. Cl.
*G01R 31/08* (2006.01)
*G01R 31/06* (2006.01)

(52) U.S. Cl. ...................................... 324/525; 324/547

(58) Field of Classification Search ................ 324/525, 324/547

See application file for complete search history.

(56) References Cited

U.S. PATENT DOCUMENTS

| 5,514,964 A | 5/1996 | Benesh et al. ............... 324/509 |
| 6,225,810 B1* | 5/2001 | Godo et al. .................. 324/525 |
| 6,271,668 B1* | 8/2001 | Sehdev et al. ............... 324/529 |
| 6,522,517 B1* | 2/2003 | Edel ........................... 361/143 |

* cited by examiner

*Primary Examiner*—Anjan Deb
*Assistant Examiner*—Amy He
(74) *Attorney, Agent, or Firm*—Ladas & Parry LLP

(57) ABSTRACT

A procedure to measure the grounding resistances of electrical installations by measuring the loop impedance. According to this procedure, using voltage generator transformers, a current is injected into the loop and this current is measured using current measurement transformers. Two transformers are united into a single transformer, used as impedance transformer, and the loop impedance is established by taking several measurements that allow determining and eliminating parameters of the transformer, by analysis of the measurement results.

9 Claims, 2 Drawing Sheets

Figure 1:
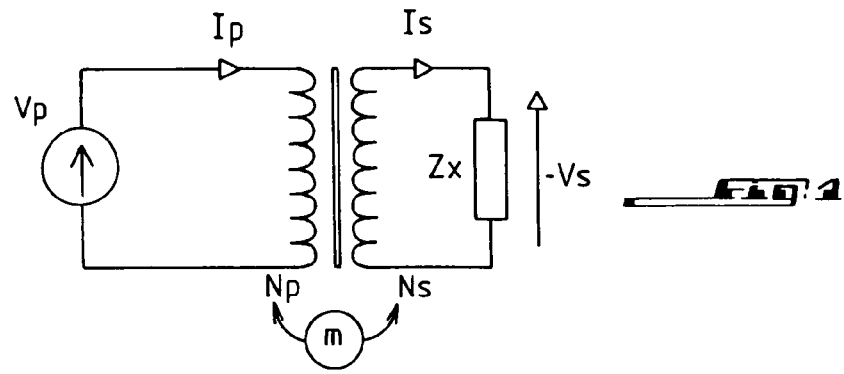

PROCEDURE TO MEASURE GROUNDING RESISTANCES OF ELECTRICAL INSTALLATIONS BY MEASURING THE LOOP IMPEDANCE

BACKGROUND ART

1. Field of the Invention

The invention concerns a procedure to measure grounding resistances of electrical installations by measuring the loop impedance, according to which we inject, using voltage generator transformers, a current into the loop and we measure this current using current measuring transformers.

2. Description of the Related Art

Known process of this type, use two different transformers to inject the current and the current measurement, which are done in the form of two grips which surround the loop to be measured, with sufficient distance between them to avoid any mutual interaction, or in the form of two grips united in a single grip, which imposes perfect magnetic isolation between the two transformers.

SUMMARY OF THE INVENTION

The purpose of this invention is to remedy these inconveniences.

BRIEF SUMMARY OF THE INVENTION

To achieve the purpose, the procedure according to the invention is characterized in that the two transformers are united into a single transformer, used as an impedance transformer, and we establish the loop impedance by taking several measurements that allow determining and eliminating parameters of the transformer, by analysis of the measurement results.

According to an advantageous characteristic of the invention, the number of measurements is made with different induction and frequency values.

According to another characteristic of the invention, we vary the induction by varying the primary input voltage of the transformer.

According to yet another characteristic of the invention, we measure separately the real part and the imaginary part of the relation between the input voltage of the transformer and the current introduced and we calculate by analyzing the measurement results the resistive and inductive parts of the impedance to be measured and the value of this impedance.

The invention will be better understood and other purposes, characteristics, details, and advantages of the invention will appear more clearly from the explanatory description below, made in reference to the schematic drawings enclosed, which are given only as examples illustrating a mode of embodiment of the invention, and in which:

BRIEF DESCRIPTION OF THE DRAWING FIGURES

Figure 2:
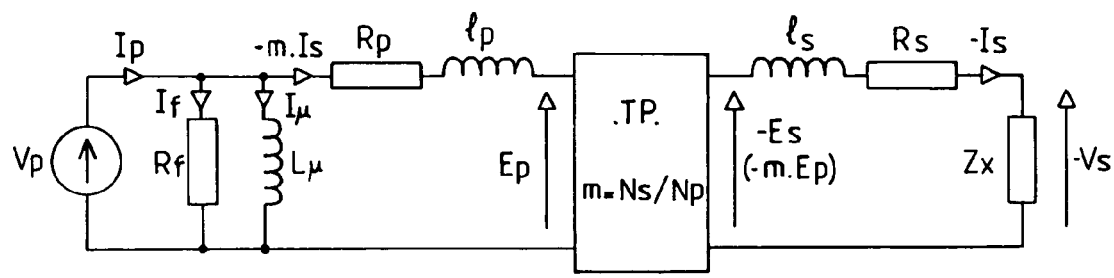
Figure 3:
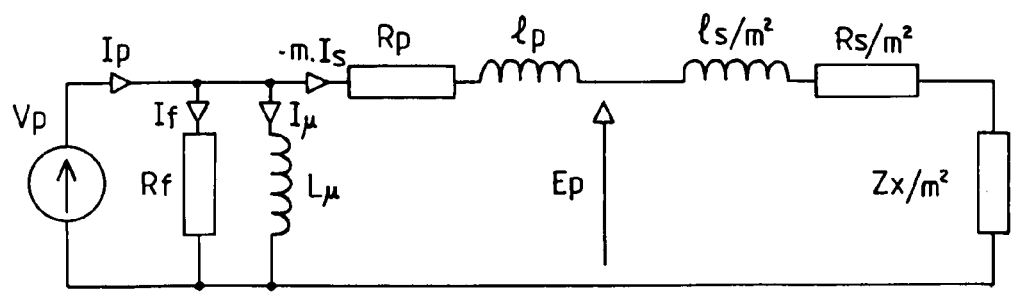
Figure 4:
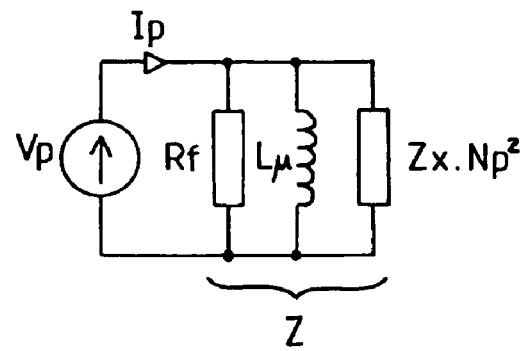
Figure 5:
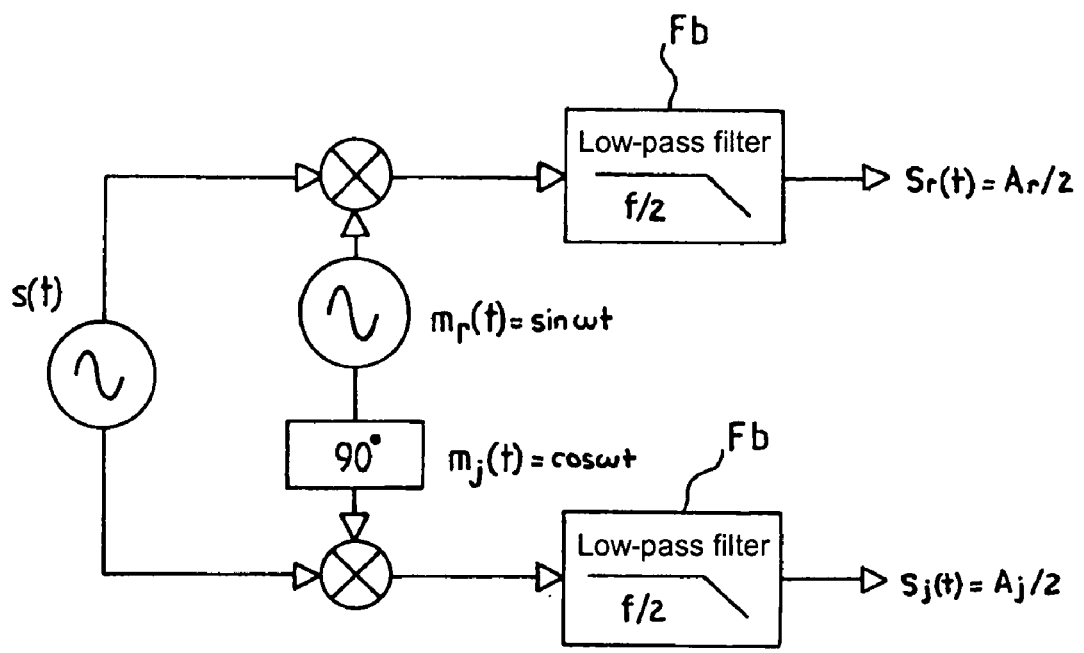

FIG. 1 gives the electric diagram of a perfect transformer;

FIG. 2 gives the equivalent electric diagram of a transformer of the type used as impedance transformer according to the invention;

FIG. 3 gives the electric diagram of the transformer according to FIG. 1, the elements being moved to the primary site;

FIG. 4 illustrates the diagram of the transformer in a simplified version; and FIG. 5 illustrates the electric diagram of a circuit which separates the real and imaginary parts of a signal.

DETAILED DESCRIPTION OF THE PREFERRED EMBODIMENTS

The invention is based on the discovery that grounding resistance can be measured directly using only the voltage transformer, which allows eliminating the current measurement transformer, as well as the magnetic insulation. The voltage transformer is then used as an impedance transformer, in the manner described below, which constitutes a measurement procedure in which, as a preliminary stage, there is a theoretical stage designed to establish the relation between the voltage applied to the terminals of the primary site of the transformer and the primary current introduced, identifying the parameters of the transformer that need to be eliminated when establishing the loop impedance, and showing these parameters in their correlation in this voltage/current relation, and the measurement stage that allows obtaining values based on which these parameters may be determined and then the loop impedance may be established by calculation.

FIG. 1 illustrates, in the form of an equivalent diagram of a perfect transformer, the purpose intended to be achieved by the invention, i.e. the measurement of a loop impedance represented by impedance $Z_x$ in the circuit of the secondary coil $N_s$ of the transformer, in which the primary coil is designated by the reference $N_p$ and at the terminals of which the voltage $V_p$ is applied. This voltage causes the circulation in the primary of the current $I_p$ which induces the voltage $V_s$ in the secondary, producing the secondary current $I_s$, where m is the ratio of the number of rotations of the secondary coil $N_s$ and the primary coil $N_p$.

In the case of the invention, the transformer is made in the form of a grip designed to hold the conductor of the loop whose impedance must be determined, said loop constituting the secondary coil $N_s$. The number of rotations of the coil is consequently equal to 1.

For this perfect impedance transformer, which has no loss of magnetic flow and whose magnetic circuit presents infinite permeability and is exempt of iron and copper losses, the impedance to be measured is expressed by the equation:

$$Z_x = V_p m^2 / I_p$$

Given that $V_p$ is the voltage applied to the terminals of the primary and therefore has a known magnitude and m is a constant, it suffices to measure the primary current $I_p$ in order to find out the impedance $Z_x$.

But, in reality, the transformer is not perfect and has losses of magnetic flow, a finite permeability of the magnet circuit and of iron and copper losses.

FIG. 2 illustrates the equivalent diagram of the real transformer, the square in the middle marked TP constituting the perfect transformer in FIG. 1 with the revolution ratio $m = N_s/N_p$. In this diagram, $R_f$ represents the resistance equivalent to the iron losses of the transformer, $L_\mu$ demagnetizing inductance of the transformer, i.e. the image of the non-infinite permeability of the magnetic circuit, $I_f$ and $L_\mu$ the components of the magnetizing current of the transformer $R_p$ the resistance of the primary coil, i.e. the image of the copper losses, $1_p$ the leak inductance of the primary, i.e. the image of the losses of magnetic flow, $R_s$ the resistance of the secondary coil, $1_s$ the leak inductance of the secondary, $E_p$ the real voltage generating the magnetic flow of the transformer, and $E_s$ the resulting voltage obtained in the secondary.

To measure the impedance $Z_x$ through the primary of the transformer, all the elements of the secondary are brought back to the primary, which gives the equivalent diagram represented in FIG. 3.

Given the particular case of the application, this equivalent diagram may be simplified with the following hypotheses:

the coil $N_s$ consists of the loop in which we want to measure the impedance; it results that $N_s=1$ and $1_s$ becomes negligible and can be considered equal to 0 and $R_s=0$.

the value of is $R_p$ negligible before $Z_x N_p^2$, hence $R_p \approx 0$.

the imposition of a distributed winding of the primary also allows supposing $1_s=0$.

Consequently, the equivalent diagram can be represented in the form illustrated in FIG. 3, which allows us to write:

$$I_p/V_p=1/Z \text{ with}$$

$$1/Z=(1/R_f)+(1/L_\mu\omega)+(1/(Z_x N_p^2))$$

Where $\omega=2\pi f$, f being the frequency of the voltage $V_p$.

By replacing resistance by conductance and impedance by admittance, we can write the previous equation in the following form:

$$I_p/V_p=V_f+Y_\mu+Y_x$$

with:

$$C_r=(1/R_f); Y_\mu=(1/L_\mu\omega); Y_x=(1/(Z_x N_p))$$

and $$Z_x=\sqrt{R_x+L_x^2\omega^2}$$

It appears from this equation that it is enough to know and/or eliminate the terms $C_f$ and $Y_m$ to determine $Y_x$ and therefore $Z_x$.

This can be done first of all by applying an indirect method which consists of first making a dry run measurement, to determine $C_f$ and $Y_\mu$ and then measuring the loop. Then it suffices to deduce the values $C_f$ and $Y_\mu$ respecting the phase displacement of its term to obtain the value of $Z_x$.

This solution is satisfactory in principle, but is not easy to implement, because the measurement operation is done in two stages, which requires to open the grip. The measurement therefore depends on the variations of the air-gaps and on the actual section of the air-gaps.

A second method, called the direct method, consists of making all measurements while maintaining the grip, i.e. without being obligated to open it during the measurement phase. Consequently, this procedure avoids the mechanical variations liable to create measurement errors in the indirect procedure.

The direct measurement procedure allows making only one sequence of measurements during which we determinate the magnitudes $C_f$, $Y_\mu$, and $Y_x$, i.e. the impedance $Z_x$.

We will describe below the establishment of these magnitudes or values:

The iron losses $C_f$ are defined by the following relation:

$$P_{fn}=P_{f0}[(B_n/B_0)^y(f_n/f_0)^z(e_n/e_0)^t(S_n/S_0)]$$

in which B designates the working induction of the transformer; f is the operating frequency, e is the thickness of the metal plate constituting the magnetic circuit, S is the actual section of the magnetic circuit, y, z, t are constants depending on the nature of the magnetic circuit, i.e. also on the permeability of the magnetic circuit and thus, of the air-gap. $P_{f_0}$ are the iron losses depending on the nature of the magnetic circuit, obtained in the induction $B_0$, at the frequency $f_0$ for a thickness of the plates $e_0$ and an actual section $S_0$ of the magnetic circuit.

On the other hand, the resistance equivalent to iron losses can be written in this form:

$$P_f=V_p^2/R_f, \text{ i.e. } P_f=V_p^2 C_f$$

which allows establishing:

$$P_{fn}=V_{pn}^2 C_{fn} \text{ and } P_{f0}=V_{p0}^2 C_{f0}$$

and, by introducing these terms in the previous equation:

$$V_{pn}^2 C_{fn}=V_{p0}^2 C_{f0}(B_n/B_0)^y(f_n/f_0)^z(e_n/e_0)^t(S_n/S_0)$$

i.e.:

$$C_{fn}=(V_{p0}^2/V_{pn}^2)C_{f0}(B_n/B_0)^y(f_n/f_0)^z(e_n/e_0)^t(S_n/S_0)$$

The thickness of the plates and the section of a magnetic circuit being constant, which allows establishing:

$(e_n/e_0)=(S_n/S_0)=1$, the expression becomes:

$$C_{fn}=A_n C_{f0}(B_n/B_0)^y(f_n/f_0)^z$$

The term $Y_\mu$ is the image of the magnetization inductance, which is in the form:

$$L=\mu_0\mu_e N_p^2(S_f L_f)$$

with $$\mu_e=1/[(1/\mu_r)+(\epsilon/L_f)]$$

where $\mu_0$ is the relative permeability of the air, $\mu_r$ the relative permeability of the magnetic material, $\mu_e$ the effective permeability of the magnetic circuit, $\epsilon$ the air-gaps of the magnetic circuit, and $L_f$ the links of the magnetic circuit.

The term $Y_x$ is expressed in the following equation:

$$Y_x=1/(Z_x N_p^2)=1/(N_p^2\sqrt{R_x^2+L_x^2\omega^2})$$

By analyzing the three expressions above, it appears that in the equation: $I_p/V_p=C_f+Y_\mu+Y_x$, $C_f$ and $Y_\mu$ depend on the frequency and induction and $Y_x$ only on frequency.

This equation can be resolved by two methods, the first consisting of finding a sequence of measurements allowing to determine separately each term, and the second by treating separately the real and imaginary parts of each term, whereby $C_f$ includes only a pure real part, while $Y_\mu$ a pure imaginary part, and $Y_x$ a real part and an imaginary part.

Concerning the second method, we can express the equation $I_p/V_p$ as follows:

$$i_p/v_p=C_f+(1/jL_\mu\omega)+[(1/N_p^2)(1/R_x+jL_x\omega)]$$

By multiplying by the conjugated expressions in order to divide into real and imaginary parts, we obtain:

$$i_p/v_p=[(R_x/(N_p^2(R_x^2+L_x^2\omega^2)))+C_f]-j[(1/L_\mu\omega)+(L_x\omega/(N_p^2(R_x^2+L_x^2\omega^2)))]$$

By considering the variation contents of the real and imaginary parts separately, we find that in the real part the expression $$R_x/(N_p^2(R_x^2+L_x^2\omega^2))$$

is a function of the frequency f, while the term $C_f$ appeared to depend only on the frequency f and induction B. We also know the variation content depending on the term f or B.

Consequently, by varying the induction B, it is possible to find out $C_f$ and to determine the term $$R_x/(N_p^2(R_x^2+L_x^2\omega^2)).$$

If the frequency is constant, the term $C_f$ can be written in the form $$C_{f_n}=A_n C_{f_0}(B_n/B_0)^y$$

It appears from the above considerations that it is possible to determine $B_n$, $B_0$, and y and therefore $C_f$ by making three measurements of the real part, with three different values of B, i.e. the voltage $V_p$ applied to the terminals of the primary air-gap of the impedance transformer, i.e. of the measurement grip.

Concerning the imaginary part J, the term $1/L_\mu\omega$ is a function of the induction B and the frequency f. Given that we do not know the variation content as a function of B due to its dependency on $\mu_r$, and therefore on the curve $B=\mu H$ which is a nonlinear function, where age is the magnetic field, we can know $L_\mu$ only by varying the frequency and provided $\mu_r$ is constant.

As to the expression $$L_x\omega/(N_p^2(R_x^2+L_x^2\omega^2))$$

it is only a function of frequency, which allows finding out the variation content.

It arises from the above that it is possible to play only on frequency to determine $L_\mu$, but it also means changing the term $$L_x\omega/(N_p^2(R_x^2+L_x^2\omega^2))$$

Yet, since the term $(R_x^2+L_x^2\omega^2)$ also intervenes in the real part, it is possible to find out the term $(R_x^2+L_x^2\omega^2)$ for two different frequency values, then determine $L_\mu$.

We then obtain a new value $C_f'$ of $C_f$, such as $$C_{f_n}'=A_n' C_{f_0}(B_n/B_0)^y \text{ with } A_n'=A_n(f_n/f_0)^z$$

It suffices then to reduce three measurements with variations of the induction B at this frequency to determine $C_f'$. But, by already knowing the term y, two variations of B suffice to determine $C_f'$. Depending on the nature of the magnetic circuit, if the term y is affected by the change in frequency, three variations of B are necessary to reach the same result.

It arises from the above considerations that, by accumulating three measurements with variations of the induction B at a frequency $f_1$, then two measurements with variation of B at the frequency $f_2$, it is possible to determine the values $R_x$ and $L_x$ and consequently the impedance $Z_x$.

As we just described, the procedure includes the separation of the real and imaginary parts, which can be done by applying to the measured current $I_p$ a double quadratic synchrone demodulation, namely a synchrone demodulation in phase with the applied voltage $V_p$, which allows obtaining the real part, and the synchrone demodulation displaced 90° versus the voltage $V_p$, which allows obtaining the imaginary part.

FIG. 4 illustrates the principle according to which it is possible to separate the real and imaginary parts. In this figure, the signal measured in which the real and imaginary parts must be separated is indicated by s(t). This signal can be written in the form:

$$S(t)=A_r \sin \omega t + A_j \cos \omega t,$$

where $A_r$ is the module of the real part of the signal s(t), $A_j$ the module of the imaginary part, and $\omega$ the pulsation of the signal measured.

The double quadratic synchrone demodulation is done according to the formulas:

$$m_r(t)=\sin(\omega t+\phi)$$

$$m_j(t)=\cos(\omega t+\phi)$$

where:

$m_r(t)$ is the demodulation applied to the real part of the signal measured.

$m_j(t)$ is the demodulation applied to the imaginary part of the signal equivalent to $m_r(t)$ displaced 90°, and $\phi$ is the residual phase displacement of the demodulation system.

By applying these formulas, we obtain for the real part of the imaginary signal:

$$S_r(t)=A_r \sin^2\omega t \cos \phi + A_j \cos^2\omega t \sin \phi + \sin \omega t \cos \omega t$$
$$(A_r \sin \phi + A_j \cos \phi)$$

By advancing the hypothesis that $\phi=0$, hence $\cos \phi=1$ and $\sin \phi=0$, we obtain:

$$S_r(t)=A_r \sin^2\omega t + A_j \sin \omega t \cos \omega t$$

and $$\sin^2\omega t=\frac{1}{2}-\frac{1}{2}(\cos^2\omega t)$$

$$\sin \omega t \cos \omega t=\frac{1}{2} \sin 2\omega t$$

According to FIG. 4, this signal $S_r(t)$ is applied to a low-pass filter Fb with a limited frequency F/2, which allows obtaining the outlet the signal $S_r(t)=A_r/2$.

We see that the demodulation made allows returning the module of the real part of the signal S(t) to a factor of approximately 2.

The demodulation of the imaginary part done in the same fashion allows obtaining $$S_r(t)=\sin \omega t \cos \omega t(A_r \cos \phi - A_j \sin \phi) - A_r \sin^2\omega t \sin \phi + A_j \cos^2\omega t \cos \phi$$

By hypothesizing that $\phi=0$, hence $\cos \phi=1$ and $\sin \phi=0$, we obtain:

$$S_j(t)=A_j[\frac{1}{2}+\frac{1}{2}(\cos^2\omega t)]+(A_r/2)\sin^2\omega t$$

This signal is applied to a low-pass filter Fb with frequency f/2 and we obtain at the outlet the signal $S_j(t)=(A_j/2)$ We see that the demodulation made allows returning the module of the imaginary part of the signal S(t) to a factor of approximately 2.

The demodulation process we describe referring to FIG. 4, supposes that the phase displacement $\phi$ is 0. If this is not the case, the influence of the angle $\phi$ translates into:

$$S_r(t)=(A_r/2)\cos \phi \text{ and } S_r(t)=(A_j/2)\cos \phi$$

As described, the procedure proposed by the invention implies five measurements which allow each time establishing a real part and an imaginary part. As shown by the table, the sequence present has three measurements made at the frequency $f_1$, but with different inductions, namely $B_{n-1}$, $B_n$, and $B_{n+1}$.

| No measurement | Value of f | Value of B | Value of Vp | Value measured | Magnitude stored before calculation | Magnitude calculated | Magnitude stored after calculation |
|---|---|---|---|---|---|---|---|
| 1 | $f_1$ | $B_{n-1}$ | $KV_p$ | $R_{n-1}$ | $R_{n-1}$ | — | — |
| 2 | $f_1$ | $B_n$ | $V_p$ | $R_n = R_1$ $J_n = J_1$ | $R_1$ $J_1$ | — | — |
| 3 | $f_1$ | $B_{n+1}$ | $V_p/k$ | $R_{n+1}$ | $R_{n+1}$ | $y$ $C_f$ $\epsilon_1$ | $y$ $\epsilon_1$ |
| 4 | $K_0 f_1$ | $B_{n+1}$ | $V_p/k$ | $R_{n+1}$ | $R_{n-1}$ | — | — |
| 5 | $K_0 f_1$ | $B$ | $V_p$ | $R_n = R_2$ $J_n = j_2$ | $R_2$ $J_2$ | $C_f$ $\epsilon_2$ $L_x \omega$ $R_x$ $Z_x$ | $L_x \omega$ $R_x$ $Z_x$ |

The different inductions are obtained by applying at the inlet terminals of the impedance transformer the voltages respectively $kV_p$, $V_p$, and $V_p/k$ while k is constant. A fourth measurement is made at the frequency $k_0 f_1$ with the voltage applied $V_p/k$ and a fifth measurement at the frequency $k_0 f_1$ and with the voltage $V_p$.

As also shown in the table, this procedure allows measuring the real and imaginary parts of the expression $I_p/V_p$, i.e. the primary current $I_p$ which is representative for the loop impedance to be established.

The first measurement made at the frequency $f_1$ with the voltage applied $kV_p$ allows measuring the real part $R_{n-1}$ which will be stored, as indicated in the table. The second measurement made at the frequency $f_1$ and with the voltage $V_p$ allows measuring the real part $R_n$ and imaginary $J_n$ called more precisely $R_1$ and $J_1$. $R_1$ and $J_1$ will be stored.

The third measurement made at the frequency $f_1$ and with the voltage $V_p/k$ provides the real part $R_{n+1}$, the fourth measurement made at the frequency $k_0 f_1$ provides the real part $R_{n+1}$.

Finally, the fifth measurement made at the frequency $k_0 f_1$ and with the voltage $V_p$ allows measuring $R_n = R_2$ and $J_{1n} = J_2$ while $R_2$ and $J_2$ are stored.

After establishing by measurement the real and imaginary magnitudes R and J, the procedure according to the invention allows establishing the loop impedance $Z_x$ by analyzing the magnitudes measured.

The real part $R_1$ and imaginary part $J_1$, obtained at the frequency $f_1$ and $R_2$ and $J_2$ obtained at the frequency $f_2$ are defined by the following equations:

$$R_1 = [R_x/N_p^2(R_x^2+L_x^2\omega^2)]+C_{f_n} J_1 = [L_x\omega/N_p^2(R_x^2+L_x^2\omega^2)]+(1/L_\mu \omega)$$

$$R_2 = [R_x/N_p^2(R_x^2+k_0^2 L_x^2\omega^2)]+C_{f_n}' J_2 = [k_0 L_x\omega/N_p^2(R_x^2+k_0^2 L_x^2\omega^2)]+(1/k_0 L_\mu \omega)$$

By developing these equations which are known per se, we obtain the expression:

$$L_x\omega = [(\epsilon_1 - \epsilon_2)/(N_p^2 \epsilon_1 \epsilon_2 (k_0^2-1))][(k_0^2 \epsilon_2 - \epsilon_1)/(k_0 J_2 - J_1)]$$

$$R_x = L_x[(k_0^2 \epsilon_2 - \epsilon_1)/(k_0 J_2 - J_1)]$$

whereby the terms $\epsilon_1$ and $\epsilon_2$ are equivalent to: $\epsilon_1 = R_1 - C_{f_n}$ and $\epsilon_2 = C_{f_n}'$ Based on the values of $R_x$ and $L_x$ we calculate the impedance $Z_x$, bringing the impedance from self to the frequency of the network, as follows:

$k'$=network frequency/measurement frequency to establish:

$$Z_x = \sqrt{R_x^2 + k'^2 L_x^2 \omega^2}$$

The resolution of the equation $R_x$ and $L_x$ requires the calculation of the terms $C_f$ and $C_f'$ which represent the iron losses.

Based on the following starting equations:

$$R_n = [R_x/N_p^2(R_x^2+L_x^2\omega^2)]+C_{f_n} = M+C_{f_n} \text{ with } M=[R_x/N_p^2(R_x^2+L_x^2\omega^2)]$$

$$C_{f_n} = A_n C_{f_0}(B_n/B_0)^y = C_{f_0}(V_{p_n}^2/V_{p_n}^2)(B_n/B_n)^y = C_{f_0}$$

$$C_{f_{n+1}} = A_{n+1} C_{f_0}(B_{n+1}/B_0)^y = C_{f_0}(V_{p_n}^2/V_{p_{n+1}}^2)(B_{n+1}/B_n)^y = C_{f_0}(V_{p_n}^2/k^2 V_{p_n}^2)(kB_n/B_n)^y = C_{f_0}(k^y/k^2)$$

$$C_{f_{n-1}} = A_{n-1} C_{f_0}(B_{n-1}/B_0)^y = C_{f_0}(V_{p_n}^2/V_{p_{n-1}}^2)(B_{n-1}/B_n)^y = C_{f_0}(k^2 V_{p_n}^2/V_{p_n}^2)(B_n/kB_n)^y = C_{f_0}(k^2/k^y)$$

$$R_{n-1} - R_n = C_{f_0}(k^2/k^y) - C_{f_0} = C_{f_0}(k^2/k^y - 1)$$

By dividing these two equations, as follows:

$$(R_n - R_{n+1})/(R_{n-1} - R_n) = (1-(k^y/k^2))/((k^2/k^y)-1) = ((k^2-k^y)/k^2)/((k^2-k^y)/k^y) = k^y/k^2$$

we obtain $$k^y = k^2[(R_n - R_{n+1})/(R_{n-1} - R_n)]$$

and $y \log k = \log [k^2[(R_n - R_{n+1})/(R_{n-1} - R_n)]]$ which allows establishing:

$$y = 2 + [\log((R_n - R_{n+1})/(R_{n-1} - R_n))/\log k]$$

Knowing the value of y, we can return to the previous equation, from which we get:

$$C_{f_0} = (R_n - R_{n+1})/(1-(k^y/k^2))$$

By analogy with the calculation of $C_{f_0}$, we obtain:

$$R_n' = [R_x/N_p^2(R_x^2+k_0^2 L_x^2\omega^2)]+C_{f_0}' = M'+C_{f_0}'$$

with $$M' = [R_x/N_p^2(R_x^2+k_0^2 L_x^2\omega^2)]$$

and $$C_{f_0}' = (R_n' - R_{n+1}')/(1-(k^y/k^2))$$

By making the calculation according to the equations written above, which were obtained by mathematical development, we can calculate the magnitudes $y$, $C_f$, $\epsilon_1$, $C_f'$, $\epsilon_2$, $L_x \omega$, $R_x$, $Z_x$ as indicated in the penultimate column of the table. After calculation, we store the indicated magnitudes in the last column, including the loop impedance $Z_x$.

The invention claimed is:

1. Procedure to measure grounding resistances of electrical installations by measuring the loop impedance, the procedure comprising the steps of:
  using voltage generator transformers, to introduce a current into the loop;
  measuring the current using current measurement transformers, wherein the voltage generator transformers and the current measurement transformers are united to form a single transformer which is used as an impedance transformer;
  and establishing the loop impedance by taking several measurements of input voltage and current that allow determining and eliminating parameters of the impedance transformer, by analysis of the input voltage and current measurement results; and
  wherein iron losses $C_f$ of the impedance transformer and an image $Y_\mu$ of the magnetizing inductance are determined to obtain the loop impedance $Z_x$ in the equation $$I_p/V_p = C_f + Y_\mu + Y_x$$

where $Y_x$ is equal to $1/Z_x$ and $I_p$ is the current measured.

2. Procedure according to claim 1, wherein the input voltage and current measurements are made with different induction and frequency values.

3. Procedure according to claim 2, wherein inductance is varied by varying a voltage $V_p$ applied to the input terminals of the impedance transformer.

4. Procedure according to claim 1, wherein the real part and the imaginary part of the relation between the input voltage $V_p$ of the impedance transformer and the current $I_p$ introduced are separately measured and calculate calculated by analyzing the input voltage and current measurement results, the resistive and inductive parts of impedance to be measured and the value of the impedance $Z_x$.

5. Procedure according to claim 4 wherein the real part R and the imaginary part J are separated by applying on the measured current $I_p$ a double quadratic synchrone demodulation.

6. Procedure according to claim 1, wherein the parameters of the real part R and imaginary part J of the relation between the input voltage $V_p$ of the impedance transformer and a current $T_p$ induced are determined by making several measurements, while keeping the grip, which constitutes the impedance transformer closed, while varying an inductance B at a first frequency $f_1$ and a second frequency $f_2 = k_0 f_1$.

7. Procedure according to claim 6 wherein three input voltage and current measurements are made at frequency $f_1$ while varying the inductance B and at least two input voltage and current measurements are made at the frequency $f_2$ while varying the inductance B.

8. Procedure according to claim 6 wherein the real part R and the imaginary part J are separated by applying on the measured current $I_p$ a double quadratic synchrone demodulation.

9. Procedure to measure grounding resistances of electrical installations by measuring the loop impedance, the procedure comprising the steps of:
  using voltage generator transformers, to introduce a current into the loop;
  measuring the current using current measurement transformers, wherein the voltage generator transformers and the current measurement transformers are united to form a single transformer which is used as an impedance transformer; and
  establishing the loop impedance by taking several measurements of input voltage and current that allow determining and eliminating parameters of the impedance transformer, by analysis of the input voltage and current measurement results; and
  wherein a dry run measurement is first made to determine iron losses ($C_f$) and an induction image ($Y_\mu$) and then the loop impedance ($Z_x$) is measured, by deducting the value of the iron losses and the inductance image while respecting the phase displacement of each value.

* * * * *